United States Patent
Poeppleman et al.

[11] Patent Number: 6,128,760
[45] Date of Patent: Oct. 3, 2000

[54] METHOD AND APPARATUS FOR CALCULATING A CRC REMAINDER

[75] Inventors: Alan D. Poeppleman; Mark D. Rutherford, both of Fort Collins, Colo.

[73] Assignee: LSI Logic Corporation, Milpitas, Calif.

[21] Appl. No.: 09/170,497

[22] Filed: Oct. 13, 1998

[51] Int. Cl.[7] .......................... H03M 13/00; G06F 11/10
[52] U.S. Cl. .......................... 714/757; 714/758; 714/785; 714/807; 708/492
[58] Field of Search ...................... 714/751, 752, 714/757, 758, 759, 763, 764, 766, 767, 781, 782, 784, 785, 807; 708/492, 650

[56] References Cited

U.S. PATENT DOCUMENTS

| | | | |
|---|---|---|---|
| 5,130,991 | 7/1992 | Takano | 714/807 |
| 5,361,266 | 11/1994 | Kodama et al. | 714/758 |
| 5,384,786 | 1/1995 | Dudley et al. | 714/784 |
| 5,410,546 | 4/1995 | Boyer et al. | 714/763 |
| 5,467,297 | 11/1995 | Zook | 708/492 |
| 5,539,756 | 7/1996 | Glaise et al. | 714/776 |
| 5,592,498 | 1/1997 | Zook | 714/763 |
| 5,619,516 | 4/1997 | Li et al. | 714/807 |
| 5,629,949 | 5/1997 | Zook | 714/769 |
| 5,642,367 | 6/1997 | Kao | 714/784 |
| 5,671,238 | 9/1997 | Chen et al. | 714/757 |
| 5,689,518 | 11/1997 | Galand et al. | 714/752 |
| 5,774,480 | 6/1998 | Willy | 714/757 |
| 5,878,057 | 3/1999 | Maa | 714/757 |
| 6,014,767 | 1/2000 | Glaize | 714/807 |

FOREIGN PATENT DOCUMENTS 0313707  10/1987  European Pat. Off. .......... H04L 1/00

*Primary Examiner*—Emmanuel L. Moise

[57] ABSTRACT

Apparatus and an associated method calculates a CRC remainder for a block of data, such as a block of data retrieved from a CD-ROM device. CRC calculations are performed to provide assurances of data integrity subsequent to error corrections of the block of data. CRC remainders associated with N powers of two are stored in the look-up table. When calculating the CRC remainder, selected values stored in the look-up table are retrieved and combined to form the CRC remainder for the block of data.

16 Claims, 4 Drawing Sheets

METHOD AND APPARATUS FOR CALCULATING A CRC REMAINDER

The present invention relates generally to a manner by which to determine data integrity of digital data, such as a block of digital data retrieved from a computer mass storage device. More particularly, the present invention relates to apparatus, and an associated method, by which to calculate a CRC (cyclic redundancy code) remainder for a block of data subsequent to error correction of the data.

A look-up table is used to store N values of CRC remainders of powers of two. The number of values, N, stored in the look-up table is dependent upon the amount of data forming the block of data. N is of a number such that $2^N$ corresponds to the size of the block of data. The values stored in the look-up table are selectively retrieved and finite-field multiplied together with an error magnitude to form a value of a CRC remainder. The product which defines the CRC remainder is associated with an error corrected at a particular location of the data. CRC remainders are determined for each location of the data at which an error is corrected, and the CRC remainders are summed together to determine the CRC remainder for the error-corrected block of data.

CRC remainders for a block of data are calculated on-the-fly, thereby reducing processing time and bandwidth required to determine the CRC remainders. And, because only N values are stored in the look-up table, only a relatively small memory is required to store the values required for CRC remainder calculations.

BACKGROUND OF THE INVENTION

Digital processing circuitry, and apparatus including such circuitry, is pervasive in modern society. The use of digital processing circuitry is advantageous as repetitive functions can be carried out at rates dramatically more quickly than that which can be performed manually. And, because of the rapid speed at which the operations can be performed, activities previously considered impractical can be readily implemented. The use of digital processing circuitry advantageously permits, e.g., the processing of large amounts of data. For instance, in a computer system, data is transferred between peripheral devices, and between peripheral devices and a CPU (central processing unit). In such processing of data, data is read from, or written to, data storage locations in successive read and write operations.

The data is stored in the form of binary bits and, when the reading or writing the data from or to the data storage locations, the binary bits are transferred. During transfer of the data, errors are sometimes introduced as a result of, e.g., channel distortion or noise. Errors can also be introduced by defects of the data storage locations at which the data is stored. The errors in the data must typically be corrected to ensure data integrity. To facilitate error correction of the data, encoding techniques are sometimes utilized to encode data prior to its transfer. Once transferred, the encoded data is thereafter decoded to recreate the values of the data, prior to its encoding and transfer. By encoding the data, redundancies are introduced upon the data. Such redundancies increase the likelihood that the data can be recovered even if errors are introduced into the data during its transfer.

Various encoding schemes have been developed and are commonly utilized in digital processing and communication devices. Reed-Solomon coding is exemplary of an encoding scheme sometimes utilized to encode digital data.

Industry-wide standards have been set forth for coding and error correction schemes to provide for intercompatibility of products and devices constructed by different manufacturers. Standards have been set forth, for instance, for the encoding of data stored on optical storage devices, such as CD-ROM storage devices. In such storage devices, data is stored in the form of blocks of data; for instance, blocks of data are sometimes formed in two-dimensional arrays. Such blocks include CRC (cyclic redundancy code) bits interleaved together with an ECC (error correction code) used for error correction operations and data integrity testing.

When the block of data is transferred, ECC-error correcting operations are performed upon the block of data to correct for errors introduced upon the data of any of the locations of the two-dimensional array. Once corrected, CRC calculations are performed upon the data to check for the correctness of the error corrections performed by the ECC-error correcting operations. If the errors have been adequately corrected, a CRC remainder, calculated during the CRC calculations is of a zero value.

In one conventional manner by which to perform CRC calculations, the block of data, along with the CRC bits, are stored in a chip memory. Error corrections are performed upon the appropriate locations of the data, the CRC remainder is calculated over the entire block of corrected data, and the data is then stored in a buffer memory.

In another manner, the data is first stored in a buffer memory, error correction is performed upon the data in the buffer memory, and, thereafter, the CRC remainder is calculated by reading the entire block of data from the buffer memory.

And, in another manner, the array of data is stored in a buffer memory, the CRC remainder on the uncorrected data is calculated as it is being stored to the buffer memory, the error locations and magnitudes of errors detected in the block of data are calculated, error corrections are performed in the buffer memory, and then the CRC remainder is adjusted by cycling through a "dummy" block of data. The "dummy" block of data is formed of zero values except for the error magnitudes at the locations of the array at which errors are detected.

All such conventional manners by which to perform error correction operations and CRC calculations require disadvantageously large amounts of storage space in a relatively expensive storage medium. Also, a large amount of buffer memory bandwidth utilization is required, large time delays are required for the processing of the error corrections and CRC calculations, and, complicated sequential ordering is required for such operations.

A manner by which to perform CRC calculations in a reduced amount of time, requiring less processing, and less bandwidth utilization would be advantageous.

It is in light of this background information related to ECC and CRC calculations that the significant improvements of the present invention have evolved.

SUMMARY OF THE INVENTION

The present invention, accordingly, advantageously provides apparatus, and an associated method, for calculating a CRC (cyclic redundancy code) remainder upon a block of data. The CRC remainder is calculated subsequent to error correction has been performed upon the block of data to correct for errors in the data.

The CRC remainders are calculated for the block of data with reduced processing time and bandwidth requirements, relative to conventional techniques by which to calculate CRC remainders upon a block of data. In one aspect of the present invention, values of CRC remainders are stored in a look-up table. N values stored in N locations of CRC remainders are stored for N powers of two. The number of values, N, stored in the look-up table is dependent upon the amount of data of which the block is formed. N is selected to be of a number such that $2^{N+1}$ is greater than or equal to the size of the block of data.

During CRC remainder calculations, the values stored in the look-up table are selectively retrieved and finite-field multiplied together with an error magnitude of an error at a particular location of the block of data. CRC remainders are determined for each location of the data at which an error is corrected. The calculated CRC remainder for each error location is summed together to determine the CRC remainder for the error-corrected block of data.

In one implementation, an error location and an error magnitude is provided to the CRC remainder calculator. Responsive to the locations of the errors, selected locations of the look-up table are accessed and values stored therein are retrieved and combined together with the error magnitude for the error location to form the CRC remainder for the particular location of the data. That is to say, a CRC remainder is stored for each of $2^N$ in the look-up table for each value of N until $2^N$ is greater than the CRC span of the block of data. For each logical "1" of a binary representation of an error location, the look-up table values are retrieved and finite-field multiplied together. The product is thereafter finite-field multiplied together with the error magnitude to form the CRC remainder for the particular error location. The CRC remainders for the error correction pattern, i.e., error correction sequence are summed together to form the CRC remainder for the block of data.

In these and other aspects, therefore, apparatus, and an associated method, calculates the CRC remainder on a block of block-encoded data. The CRC remainder is calculated at a data receiver operable to receive an error corrected block of block-encoded data. A block of the block-encoded data includes a CRC used to determine data integrity of the data. The CRC remainder is calculated once the block of data is error corrected at the data receiver, and the CRC remainder is calculated responsive to indications of an error location and error value of each error corrected during error correcting of the block of data. A plurality of CRC remainders are stored at a storage element having a plurality of storage locations. Each CRC remainder is indexed together with a binary-power value of a set of binary-power values. A selected combination of binary-power values define each location of the block of data. A CRC remainder accessor and retriever is coupled to receive the indications of each error location and to the storage element. The CRC remainder accessor and retriever accesses each storage location of the storage element indexed together with each binary-power value of the selected combination corresponding to the error location and for retrieving the CRC remainder stored thereat. A combiner is coupled to the CRC remainder accessor and retriever and to receive the indications of the error value of each error location. The combiner combines together each CRC remainder retrieved by the CRC remainder accessor and retriever associated with an error and the error value to form a combined value. A summer sums together each combined value formed by the combiner to form a summed value. The summed value comprises the syndrome of the block of block-encoded data.

A more complete appreciation of the present invention and the scope thereof can be obtained from the accompanying drawings which are briefly summarized below, the following detailed description of the presently-preferred embodiments of the invention and the appended claims.

DETAILED DESCRIPTION OF THE PREFERRED EMBODIMENT

Figure 1:
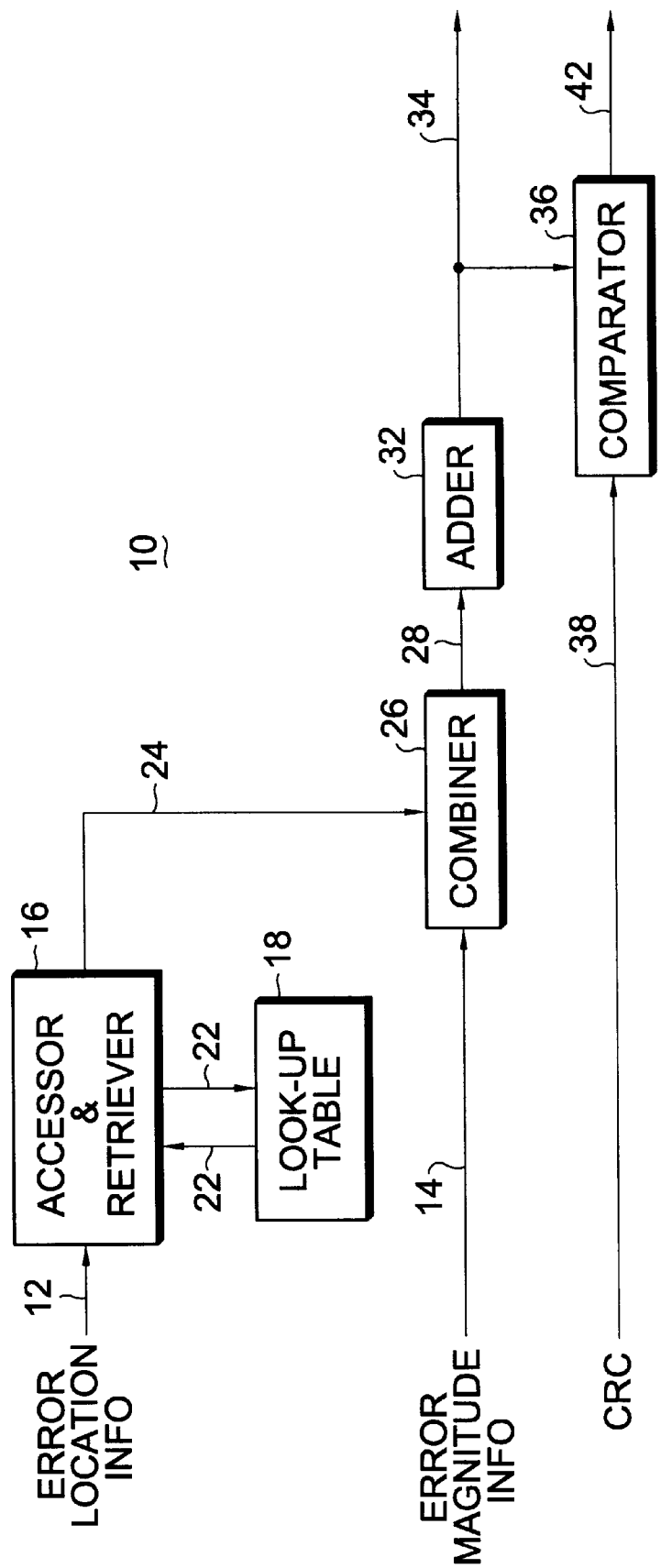
FIG. 1 illustrates a functional block diagram of the apparatus for calculating a CRC remainder according to an embodiment of the present invention.

The use of CRC (cyclic redundancy code) bits in a block of digital data is commonly used for purposes of determining data integrity. Mathematical operations performed upon the CRC bits provide indications of data integrity subsequent to error correction operations performed upon a block of data of which the CRC bits form a portion. Typically, the CRC bits are positioned within a correction field of error-correction code. Determination of whether the block of data, also sometimes referred to as a sector is good, i.e., free of errors, is made by checking the CRC bits of the sector. More particularly, a CRC remainder is calculated, and the result of such operation forms the CRC syndrome. The CRC syndrome, r(x), is defined as follows:

$$r(x) = \text{rem}\left[\frac{c(x)}{g(x)}\right]$$

where:
r(x) is the CRC syndrome,
c(x) is the received code word, and
g(x) is the generator polynomial.

The received code word, c(x), in an exemplary calculation, includes synchronization, header, data, and EDC fields of a sector of data. If none of the locations of the sector of data includes errors, subsequent to error-correction operations performed thereon, the CRC syndrome equals zero, i.e., r(x) equals zero. When corrections are made to data locations of a sector of data, the CRC syndrome must be recalculated to determine whether the corrections were successfully effectuated. The received code word may be fairly lengthy, e.g., 2068 bytes, in length, and the generator polynomial might be a higher-order polynomial, computation of the CRC syndrome might require a significant amount to calculate and recalculate. To simplify the required operations, the received code word c(x) can be re-written as follows:

$$c(x) = t(x) + e(x)$$

Wherein:
t(x) is the transmitted code word, and
e(x) is the error pattern.

Both sides of the equation can be divided by the generator polynomial, and remainders taken thereon as follows:

$$\text{rem}\left[\frac{c(x)}{g(x)}\right] = \text{rem}\left[\frac{t(x)}{g(x)}\right] + \text{rem}\left[\frac{e(x)}{g(x)}\right]$$

Because the remainder of a transmitted code word is always equal to zero, the equation can be simplified as follows:

$$\text{rem}\left[\frac{c(x)}{g(x)}\right] = \text{rem}\left[\frac{e(x)}{g(x)}\right]$$

Rather than tracking the entire error pattern, the CRC syndrome can be adjusted for each location of which data is corrected:

$$\text{rem}\left[\frac{c(x)}{g(x)}\right] = \sum_{i=1}^{n}\text{rem}\left[\frac{e_i(x)}{g(x)}\right]$$

where:
$e_i(x)$ is the error pattern of the ith error, and
n is the number of errors in the sector.
And, the error pattern can be rewritten as follows:

$$\text{rem}\left[\frac{c(x)}{g(x)}\right] = \sum_{i=1}^{n}\text{rem}\left[\frac{x^{j_i}Y}{g(x)}\right]$$

where:
$j_i$ is the location of the ith error, and
Y is the error magnitude.
For each error that is corrected, an adjustment magnitude is computed as follows:

$$a_i(x) = \text{rem}\left[\frac{x^jY}{g(x)}\right]$$

$$a_i(x) = \text{rem}\left[\text{rem}(Y)\prod_{k=1}^{14}\text{rem}\left(x^{2^{k(j(k))}}\right)\right]$$

where:
$a_i(x)$ is the adjustment magnitude of the ith error,
j is the location of the error,
j [k] is the kth bit of j, and
rem( . . . ) is the remainder after dividing by g.

The remainder of the exponential power of x can be precalculated and stored in a look-up table. Instead of calculating a remainder at each error, the memory contents at the appropriate memory location can instead be accessed and retrieved. And, as j[k] is a bit select of j, and, when data locations are formed of 8-bit bytes, j is a multiple of 8 bits, therefore, values for k range from three to fourteen. Y, the error magnitude, is of a degree smaller than the generator polynomial, g(x), therefore, rem[Y]=Y.

FIG. 1 illustrates the apparatus, shown generally at 10, operable to calculate a CRC remainder according to an embodiment of the present invention. The apparatus 10 is coupled to receive error location information on the line 12 and error magnitude information on the line 14. Such information is determined during error correction operations performed upon a block of data. The error location information is a binary representation of the location of a block of data at which a byte of data has been corrected. For instance, if an error is corrected at location 10 of the block of data, the binary representation 1010 is generated on the line 12.

The line 12 is coupled to an accessor and retriever 16. The accessor and retriever 16 is operable responsive to reception of the error location information to access memory locations of a look-up table 18 by way of the lines 22. The look-up table 18 includes values of CRC remainders associated with powers of two of which the error location information can be comprised. That is to say, a memory location of the look-up table 18 is associated with the powers of two, i.e., 1, 2, 4, 8, 16, . . . , of which the binary representation of the error location information can be formed. As the error location information 12 is a binary representation of a location of the block of data, the number of memory locations of the look-up table 18 corresponds to the power of two associated with the largest-numbered data location of the block of data. When, for instance, the error location information is of a value 1010, CRC remainders stored in the look-up table 18 and associated with the values 2 and 8 ($x^2$ and $x^8$) are accessed and retrieved by the accessor and retriever 16 and generated on the line 24.

The line 24 is coupled to a combiner 26. The combiner 26 is further coupled to the line 14 to receive the error magnitude information generated thereon. The combiner 26 is operable to combine the values provided thereto by way of the lines 14 and 24 in a finite-field multiplication process. For instance, when CRC remainders associated with memory locations 2 and 8 are provided to the combiner, during a first step, the CRC remainder associated with memory location 2 is finite-field multiplied together with the error magnitude information to form a first product. Then, when the CRC remainder associated with the memory location 8 is provided to the combiner, the first product is finite-field multiplied together with the additional CRC remainder value. The resultant product is generated on the line 28 and provided to an adder 32. Successive values generated by the combiner 26 associated with different locations at which errors are corrected are summed by the adder 32, and the resultant sum is generated on the line 34. The value generated on the line 34 is the CRC remainder forming the CRC syndrome, r(x), associated with the error sequence, subsequent to error correction operations performed thereon.

The apparatus 10 of FIG. 1 further includes a comparator 36. The comparator is coupled to line 34 to receive the CRC remainder generated during operation of the apparatus 10 and also to the line 38. An externally-generated CRC syndrome generated by the error correction circuitry, is provided on the line 38. The comparator 36 is operable to compare the values generated on the lines 34 and 38. If error correction has been successfully performed, the values provided to the comparator are similar. If the values are dissimilar, the error correction operations are likely to have been inadequately performed and an indication of value dissimilarity generated by the comparator on the line 42 acts as an error indication.

Figure 2:
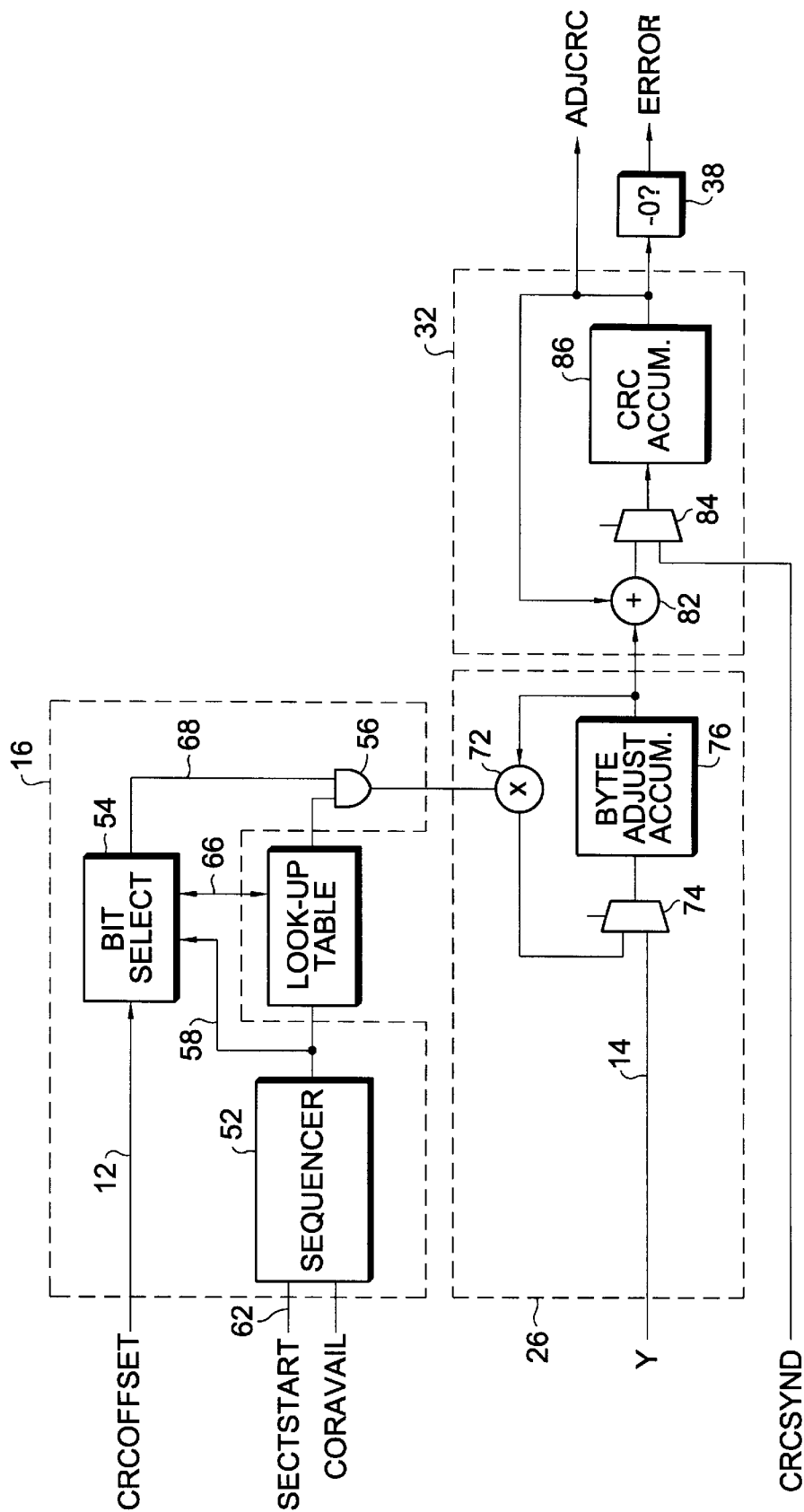
FIG. 2 illustrates the apparatus shown in FIG. 1 in greater detail.

FIG. 2 illustrates again the apparatus 10, shown also in FIG. 1. Here, the accessor and retriever 16 is shown to include a sequencer 52, a bit selector 54, and a logic gate 56. Here, the line 12 upon which the binary representation of the error location information is generated is provided to the bit selector 54. The bit selector 54 is further coupled, by way of the line 58 to a sequence signal generated by the sequencer 52. The sequencer 52 is coupled to receive an indication (identified by sectstart) of the start of a sector on the line 62 and to receive an indication that a correction has been performed (indicated by corvail) and that the location and magnitude of such correction are available on the lines 12 and 14. The sequence signal generated by the sequencer 52 is further applied to the look-up table 18.

As the bits of the error location information provided on the line 12 are applied to the bit selector 54, appropriate memory locations of the look-up table 18 are accessed and generated on the line 66 to form an input to the logic gate 56. The bit selector 54 is further coupled to the logic gate 56, here by way of the line 68. When a binary value of the error location information 12 is of a logical one value, the logic gate 56 passes the retrieve value, retrieved from the table 18. The value is generated on the line 24 and provided to the combiner 26.

The combiner 26 is here shown to include a multiplier 72, a logic gate 74, and a byte adjuster accumulator 76. The multiplier 72 is coupled in a loop formed between an output of the accumulator 76 and an input of the logic gate 74, here a multiplexer, i.e., "mux." The line 14 is also coupled to the mux 74. The mux 74 is operable to combine the magnitude information generated on the line 14 with a first of the values retrieved from the table 18 and generated on the line 24. The mux 74 selects passage of either the information provided thereto on the line 14 or the output of the multiplexer through the feedback path. The resultant product is stored in the accumulator 76. Subsequent values retrieved from the table 18 and generated on the line 24 are multiplied together with the accumulated values stored in the accumulator 76 by the multiplier 72 and the resultant product is thereafter stored in the accumulator 76. When the CRC remainder associated with a particular error location is calculated, indications are generated on the line 28 and provided to the adder 32.

The adder 32 is here shown to include a summer 82, a gate 84, and a CRC accumulator 86. CRC values are loaded into the accumulator 86. The summer 82 is operable to sum together values provided thereto by way of the line 28 together with values stored at the accumulator 86. Resultant sums are stored in the accumulator 86, thereafter to form the CRC remainder calculated by the apparatus 10 and generated on the line 34. The externally-generated CRC syndrome provided on the line 38 is here shown to be provided to the gate 84 of the adder 32. Such value is provided together with the CRC remainder generated by the apparatus 10 to the comparator 38 at which comparisons are performed. If the apparatus-generated CRC remainder differs from the externally-generated CRC, an error indication is generated on the line 42. In the implementation shown in FIG. 2, values of the CRC remainder are loaded into the accumulator 86 and the accumulated values are compared at the comparator to determine whether the accumulated value equals zero. If not zero, an error is indicated. In another implementation, and as shown generally in FIG. 1, the accumulator is initially loaded with a zero value, and thereafter a comparison is made between the resultant accumulated value and the input CRC value.

Figure 3:
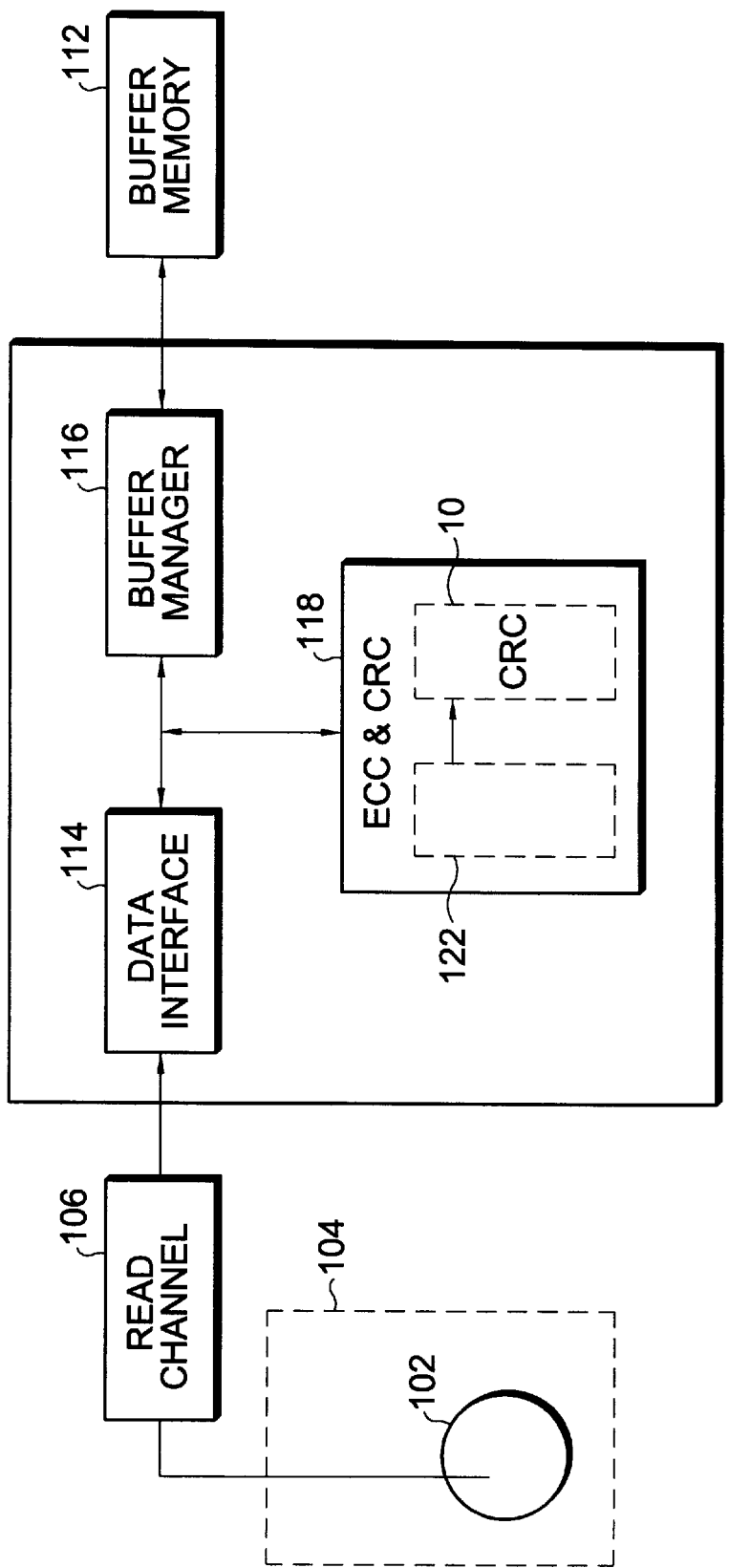
FIG. 3 illustrates a functional block diagram of the apparatus shown in FIG. 1 together with a storage device at which blocks of data are retrieved.

FIG. 3 illustrates a portion of a computer system, shown generally at 100, in which an embodiment of the present invention is operable. The illustrated portion of the computer system 100 is here shown to include a CD-ROM, memory storage device 102 forming a portion of an optical drive 104. The drive 104 is coupled by way of a read channel 106 through a data card 108. The data card 108, in turn, is coupled to a buffer memory 112.

The data card 108 includes a CD data interface 114 coupled by way of the read channel 106 to the optical drive 104. The data card 108 further includes a buffer manager 116 coupled between the data interface 114 and the buffer memory 112. And, the data card 108 further includes an error corrector and data integrity verifier 118 coupled to receive the data read from the storage medium 102 by way of the read channel 106 and interface 114. The corrector and the verifier 118 is here shown to include an ECC corrector 122 and the apparatus 10, shown previously in FIGS. 1 and 2.

During operation of the computer system 100, data is read from the CD-ROM storage medium 102 and provided to the buffer memory 112. As the data is read from the storage medium 102, such data is provided to the corrector and verifier 118. The elements 122 and 10 are operable, as the data is read, to perform ECC error-correction calculations upon the data. And, once error correction has been effectuated, the apparatus 10 is operable to calculate the CRC remainders forming the CRC syndrome.

Figure 4:
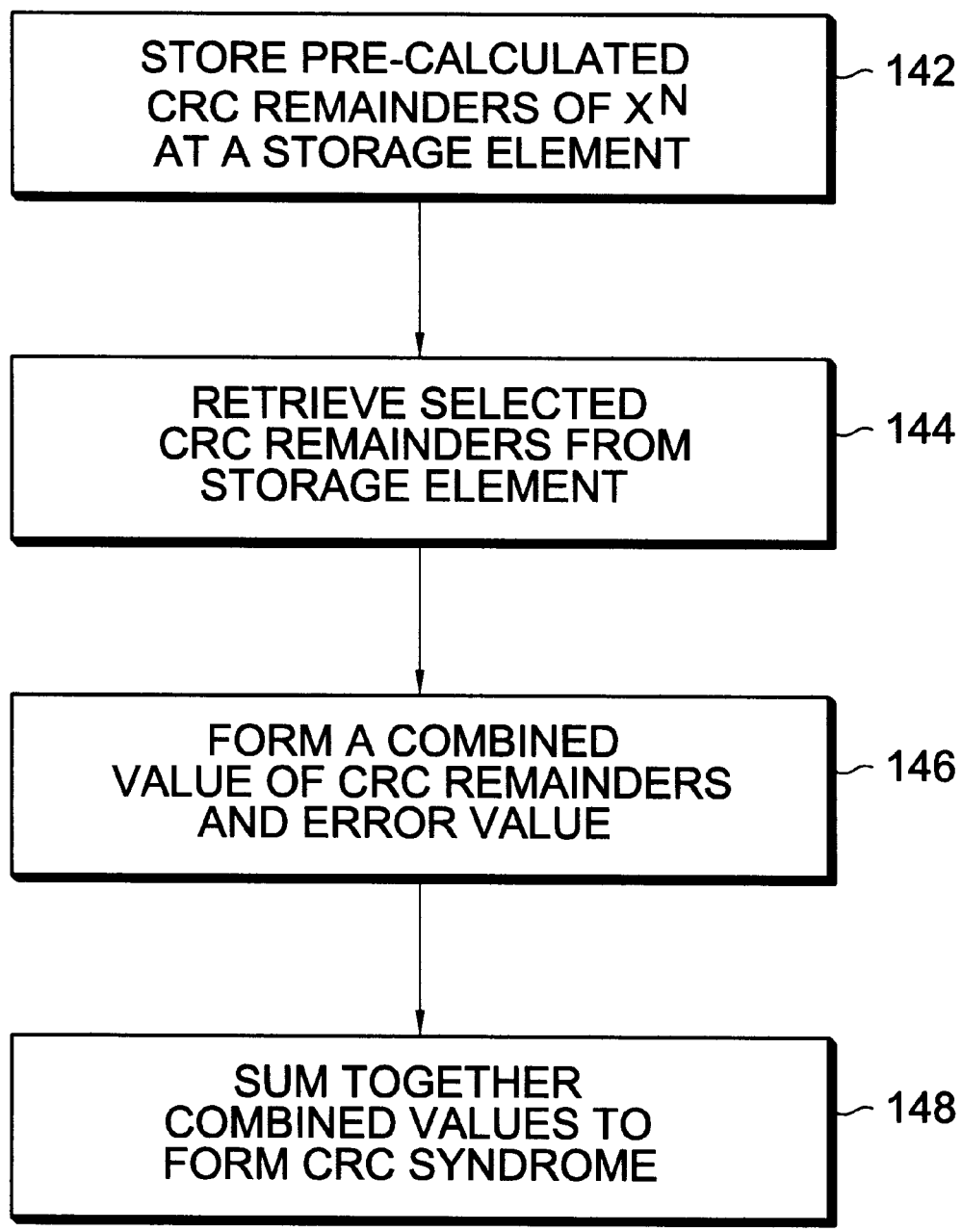
FIG. 4 illustrates a method flow diagram listing the method steps of the method of an embodiment of the present invention.

FIG. 4 illustrates the method, shown generally at 140, of an embodiment of the present invention. The method 140 calculates the CRC syndrome of a block of block-encoded data subsequent to error-correction of the data.

First, and as indicated by the block 142, a plurality of CRC remainders are stored at storage locations of a storage element. Each CRC remainder is indexed together with a binary-power value of a set of binary-power values. The selected combination of binary-power values define each location of the block of data. Then, and as indicated by the block 144, the CRC remainder indexed together with each binary-power value of the selected combination are retrieved. The selected combination of binary-power values corresponds to the error location at which an indication is generated by an error corrector.

Then, and as indicated by the block 146, the CRC remainders are combined together with an error value to form a combined value. Then, and as indicated by the block 148, the combined values are summed together. The sum value forms the CRC syndrome of the block of block-encoded data.

Thereby, through operation of an embodiment of the present invention, a CRC remainder, or syndrome, for a block of data is calculated by accessing values stored in a look-up table. The values stored at the look-up table are selectively combined to form the CRC remainder for a block of data. The CRC remainder is calculated in a manner requiring only reduced processing time and bandwidth of data transfer.

The previous description are of preferred examples for implementing the invention, and the scope of the invention should not necessarily be limited by this description. The scope of the present invention is defined by the following claims.

We claim:

1. In a data receiver for receiving and error correcting a block of block-encoded data, the block of block-encoded data including a CRC (cyclic redundancy code), an improvement of apparatus for calculating a CRC remainder of the block of block-encoded data subsequent to error correction, once error corrected by the data receiver, responsive to indications of an error location and error value of each error corrected during error correcting of the block of data, said apparatus comprising:

a storage element having a plurality of storage locations for storing a plurality of CRC remainders, each CRC remainder indexed together with a binary-power value of a set of binary-power values, a selected combination of binary-power values defining each location of the block of data;

a CRC remainder accessor and retriever coupled to receive the indications of each error location and to said storage element, said CRC remainder accessor and retriever for accessing each storage location of said storage element indexed together with each binary-power value of the selected combination corresponding to the error location and for retrieving the CRC remainder stored thereat;

a combiner coupled to said CRC remainder accessor and retriever and to receive the indications of the error value of each error location, said combiner for combining together each CRC remainder retrieved by said CRC remainder accessor and retriever associated with an error and the error value to form a combined value; and a summer for summing together each combined value formed by said combiner to form a summed value, the summed value comprising the CRC syndrome of the block of block-encoded data.

2. The apparatus of claim 1 wherein an error corrector generates the indications of the error location and the error value and also a CRC value, said apparatus further comprising a comparator coupled to receive the CRC value and the summed value formed by said summer, said comparator for comparing the CRC value and the summed value and for generating an error signal when comparisons made therebetween indicate dissimilarity of the summed value and the CRC value.

3. The apparatus of claim 1 wherein the block of block-encoded data comprises $2^x$ locations and wherein said storage elements comprises X storage locations, each of the X storage locations for storing a CRC remainder therein.

4. The apparatus of claim 1 wherein the indication of the error location comprises a binary value and wherein said CRC remainder accessor and retriever provides CRC remainders to said combiner corresponding to binary orders of magnitude of the binary value containing logical "1" values.

5. The apparatus of claim 4 wherein said combiner finite-field multiplies the CRC remainders provided thereto together with the indication of the error value.

6. The apparatus of claim 1 wherein said summer comprises an accumulator for storing accumulated values of the summed value formed by said summer for each corrected error.

7. The apparatus of claim 1 wherein the block of block-encoded data is received from a sector of a mass-storage memory device and wherein the indications of each of the error locations received by said CRC remainder accessor and retriever indicate a location of the sector of the mass-storage memory device.

8. The apparatus of claim 1 wherein each CRC remainder stored in said storage element is calculated by dividing an error pattern by a generator polynomial.

9. The apparatus of claim 1 wherein said storage element comprises a read-only memory.

10. A method for calculating a CRC syndrome of a block of block-encoded data subsequent to error-correction of the block of the block-encoded data by an error corrector, the error corrector generating indications of an error location and an error value for each error corrected by the error corrector, the block of the block-encoded data including a CRC (cyclic redundancy code), said method comprising the acts of:

storing a plurality of CRC remainders at storage locations of a storage element, each CRC remainder indexed together with a binary-power value of a set of binary-power values, a selected combination of binary-power values defining each location of the block of data;

retrieving the CRC remainder indexed together with each binary-power value of the selected combination of binary-power values corresponding to the error location of which the indication thereof is generated by the error corrector;

combining together each CRC remainder retrieved during said step of retrieving associated with an error of which the indication thereof is generate by the error corrector and the error value associated therewith to form a combined value;

summing together each combined value formed during said step of combining to form a summed value, the summed value comprising the CRC syndrome of the block of block-encoded data.

11. The method of claim 10 wherein the error corrector further generates a CRC value and wherein said method further comprises comparing the CRC value with the summed value formed during said step of summing.

12. The method of claim 11 further comprising generating an error signal when comparisons performed during said step of comparing indicate the CRC value to be dissimilar with the summed value.

13. The method of claim 10 wherein the block of block-encoded data comprises $2^x$ locations and wherein CRC remainders are stored in X storage locations of the storage element.

14. The method of claim 10 wherein the indications of the error location comprises a binary value and wherein said act of retrieving the CRC remainder comprises retrieving CRC remainders corresponding to binary orders of magnitude of the binary value containing logical "1" values.

15. The method of claim 14 wherein said act of combining comprises finite-field multiplying the CRC remainders retrieved during said step of retrieving together with the indication of the error value.

16. The method of claim 10 wherein said act of summing further comprises accumulating successive indications of the summed value.

* * * * *